(12) United States Patent
Yeh et al.

(10) Patent No.: US 11,594,190 B2
(45) Date of Patent: Feb. 28, 2023

(54) DISPLAYS WITH SUPPLEMENTAL LOADING STRUCTURES

(71) Applicant: Apple Inc., Cupertino, CA (US)

(72) Inventors: Shin-Hung Yeh, Taipei (TW); Abbas Jamshidi Roudbar, Saratoga, CA (US); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/401,117

(22) Filed: Aug. 12, 2021

(65) Prior Publication Data

US 2021/0375225 A1 Dec. 2, 2021

Related U.S. Application Data

(63) Continuation of application No. 16/518,527, filed on Jul. 22, 2019, now Pat. No. 11,100,877, which is a continuation of application No. 15/980,437, filed on May 15, 2018, now Pat. No. 10,360,862.

(60) Provisional application No. 62/555,457, filed on Sep. 7, 2017.

(51) Int. Cl.
*G09G 3/36* (2006.01)
*G02F 1/1362* (2006.01)
*G09G 3/00* (2006.01)
*H01L 27/12* (2006.01)

(52) U.S. Cl.
CPC ..... *G09G 3/3666* (2013.01); *G02F 1/136286* (2013.01); *G09G 3/002* (2013.01); *G09G 3/3648* (2013.01); *H01L 27/124* (2013.01); *G02F 2201/121* (2013.01); *G09G 2300/0413* (2013.01); *G09G 2300/0426* (2013.01);
(Continued)

(58) Field of Classification Search
None
See application file for complete search history.

(56) References Cited

U.S. PATENT DOCUMENTS

| 8,363,191 B2 | 1/2013 | Yoshida |
| 8,471,796 B2 | 6/2013 | Kwon et al. |
| 9,646,541 B2 | 5/2017 | Kim |

(Continued)

FOREIGN PATENT DOCUMENTS

| CN | 1503043 A | 6/2004 |
| CN | 1787706 A | 6/2006 |

(Continued)

*Primary Examiner* — Krishna P Neupane
(74) *Attorney, Agent, or Firm* — Treyz Law Group, P.C.; Kendall P. Woodruff

(57) ABSTRACT

A display may have an array of pixels such as liquid crystal display pixels. The display may include short pixel rows that span only partially across the display and full-width pixel rows that span the width of the display. The gate lines coupled to the short pixel rows may extend into the inactive area of the display. Supplemental gate line loading structures may be located in the inactive area of the display to increase loading on the gate lines that are coupled to short pixel rows. The supplemental gate line loading structures may include data lines and doped polysilicon that overlap the gate lines in the inactive area. In displays that combine display and touch functionality into a thin-film transistor layer, supplemental loading structures may be used in the inactive area to increase loading on common voltage lines that are coupled to short rows of common voltage pads.

20 Claims, 13 Drawing Sheets

(52) U.S. Cl.
CPC ............... *G09G 2300/0478* (2013.01); *G09G 2310/0264* (2013.01); *G09G 2320/0223* (2013.01)

(56) References Cited

U.S. PATENT DOCUMENTS

| | | |
|---|---|---|
| 2002/0190971 A1 | 12/2002 | Nakamura et al. |
| 2004/0100431 A1 | 5/2004 | Yoshida |
| 2006/0132055 A1 | 6/2006 | Kwak |
| 2009/0102824 A1* | 4/2009 | Tanaka ................. G09G 3/3648 345/55 |
| 2009/0189835 A1 | 7/2009 | Kim et al. |
| 2010/0020059 A1 | 1/2010 | Suh |
| 2010/0156945 A1 | 6/2010 | Yoshida |
| 2011/0267293 A1 | 11/2011 | Noguchi et al. |
| 2014/0125626 A1 | 5/2014 | Yang et al. |
| 2015/0325593 A1 | 11/2015 | Shih et al. |
| 2016/0071884 A1* | 3/2016 | Miyamoto .......... H01L 27/1251 257/59 |
| 2016/0111040 A1* | 4/2016 | Kim ..................... G09G 3/2096 257/773 |
| 2016/0239131 A1 | 8/2016 | Kang |
| 2017/0102824 A1 | 4/2017 | Kang et al. |
| 2017/0193914 A1 | 7/2017 | Heo et al. |
| 2017/0193963 A1 | 7/2017 | Pan et al. |
| 2017/0249896 A1 | 8/2017 | Kim et al. |
| 2017/0301280 A1* | 10/2017 | Ka ....................... H01L 27/3223 |
| 2018/0005585 A1* | 1/2018 | Kim ..................... G09G 3/3266 |
| 2018/0188616 A1 | 7/2018 | Jeong et al. |

FOREIGN PATENT DOCUMENTS

| | | |
|---|---|---|
| CN | 101536061 A | 9/2009 |
| CN | 101536064 A | 9/2009 |
| CN | 102236464 A | 11/2011 |
| CN | 102566171 A | 7/2012 |
| CN | 103034003 A | 4/2013 |
| CN | 104049790 A | 9/2014 |
| CN | 105404064 A | 3/2016 |
| CN | 106991990 A | 7/2017 |
| CN | 107134473 A | 9/2017 |
| CN | 107749247 A | 3/2018 |
| CN | 209265147 U | 8/2019 |
| EP | 2085952 A1 | 8/2009 |
| EP | 3211671 A1 | 8/2017 |
| JP | H10268348 A | 10/1998 |
| JP | 2003029269 A | 1/2003 |
| JP | 2004101615 A | 4/2004 |
| JP | 2004177528 A | 6/2004 |
| JP | 2010231773 A | 10/2010 |
| JP | 2017142303 A | 8/2017 |
| JP | 2019070744 A | 5/2019 |
| KR | 10-2010-0010594 | 2/2010 |
| KR | 20160009805 A | 1/2016 |
| WO | 2007105700 A1 | 9/2007 |
| WO | 2008062575 A1 | 5/2008 |
| WO | 2017172375 A1 | 10/2017 |
| WO | 2018012455 A1 | 1/2018 |

* cited by examiner

DISPLAYS WITH SUPPLEMENTAL LOADING STRUCTURES

This application is a continuation of patent application Ser. No. 16/518,527, filed Jul. 22, 2019, which is a continuation of patent application Ser. No. 15/980,437, filed May 15, 2018, now U.S. Pat. No. 10,360,862, which claims the benefit of provisional patent application No. 62/555,457, filed Sep. 7, 2017, all of which are hereby incorporated by reference herein in their entireties.

BACKGROUND

This relates generally to electronic devices, and, more particularly, to electronic devices with displays.

Electronic devices such as cellular telephones, computers, and other electronic devices often contain displays. A display includes an array of pixels for displaying images to a user. Display driver circuitry such as data line driver circuitry may supply data signals to the array of pixels. Gate line driver circuitry in the display driver circuitry can be used to assert a gate line signal on each row of pixels in the display in sequence to load data into the pixels.

Brightness variations may also arise from control issues in displays with non-rectangular shapes. If care is not taken, effects such as these may adversely affect display performance.

SUMMARY

A display may have an array of pixels such as liquid crystal display pixels controlled by display driver circuitry. The display driver circuitry may supply the pixels with data signals over data lines in columns of the pixels and may supply the pixels with gate line signals over gate lines in rows of the pixels. Gate driver circuitry in the display driver circuitry may be used in supplying the gate lines signals.

The gate driver circuitry may have gate driver circuits each of which supplies a respective one of the gate lines signals to the pixels in a respective row of the array of pixels. Different rows in a display may have different numbers of pixels and may therefore be characterized by different amounts of capacitive loading. To ensure brightness uniformity for the display, a display may be provided with row-dependent supplemental gate line loading structures.

The gate lines coupled to the short pixel rows may extend into the inactive area of the display. Supplemental gate line loading structures may be located in the inactive area of the display to increase loading on the gate lines that are coupled to short pixel rows. The supplemental gate line loading structures may include data lines and doped polysilicon that overlap the gate lines in the inactive area.

The doped polysilicon may be coupled to a bias voltage supply line such as a ground line or other signal line. A transparent conductive layer such as an extension of a common electrode voltage layer may be used in the inactive area of the display to couple the polysilicon to the bias voltage supply line. In other arrangements, a metal layer may be used to couple the polysilicon to the bias voltage supply line. The metal layer may be formed from the same material that forms the data lines in the active area of the display.

In displays that combine display and touch functionality into a thin-film transistor layer, supplemental loading structures may be used in the inactive area to increase loading on common voltage lines that are coupled to short rows of common voltage pads. The supplemental loading structures may include transparent conductive electrodes that respectively overlap the common voltage pads in the inactive area. The transparent conductive electrodes may be formed from the same material as the pixel electrodes in the active area of the display. The transparent conductive electrodes and the common voltage pads form capacitors that increase the capacitive loading on the common voltage lines that are coupled to short rows of common voltage pads.

DETAILED DESCRIPTION

Figure 1:
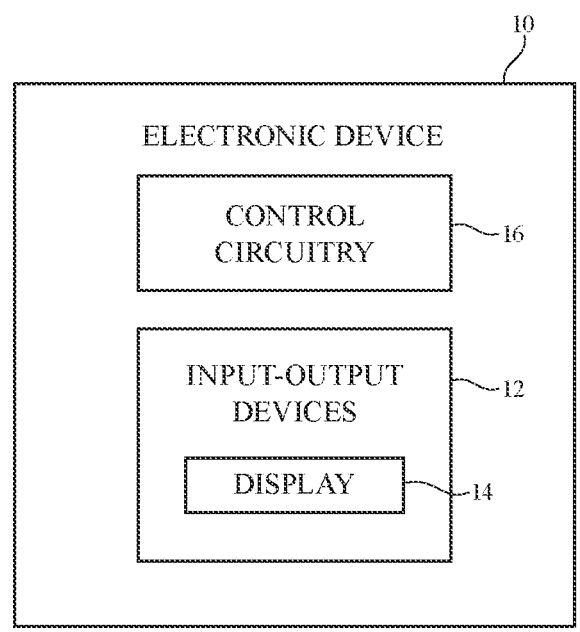
FIG. 1 is a schematic diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may be an organic light-emitting diode display, a liquid crystal display, an electrophoretic display, an electrowetting display, a display based on an array of discrete crystalline light-emitting diode dies, or a display based on other types of display technology. Configurations in which display 14 is a liquid crystal display may sometimes be described herein as an example.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
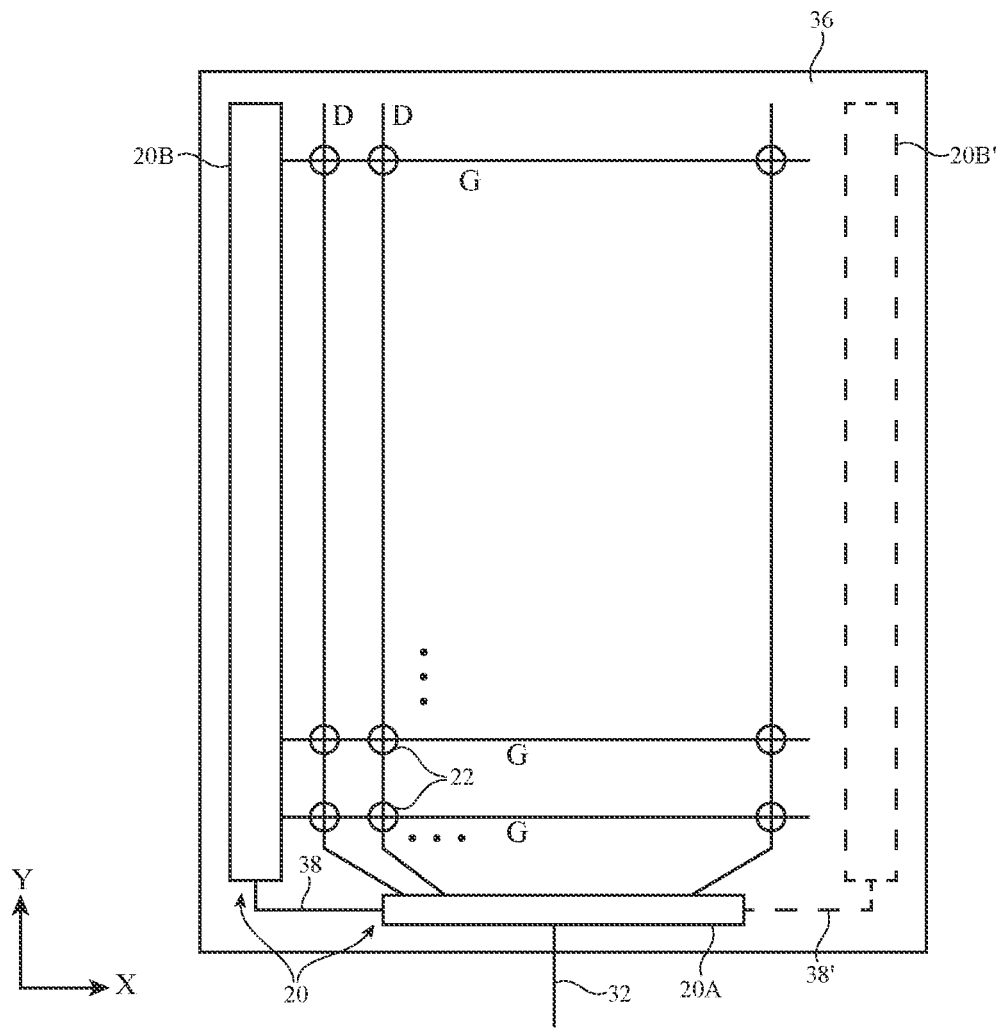
FIG. 2 is a top view of an illustrative display in an electronic device in accordance with an embodiment.

A top view of a portion of display 14 is shown in FIG. 2. As shown in FIG. 2, display 14 may have an array of pixels 22 formed from substrate structures such as substrate 36. Substrates such as substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, gate signal paths, etc.). There may be any suitable number of rows and columns of pixels 22 in display 14 (e.g., tens or more, hundreds or more, or thousands or more). In organic light-emitting diode displays, pixels 22 contain respective light-emitting diodes and pixel circuits that control the application of current to the light-emitting diodes. In liquid crystal displays, pixels 22 contain pixel circuits that control the application of signals to pixel electrodes that are used for applying controlled amounts of electric field to pixel-sized portions of a liquid crystal layer. The pixel circuits in pixels 22 may contain transistors having gates that are controlled by gate line signals on gate lines G.

Display driver circuitry 20 may be used to control the operation of pixels 22. Display driver circuitry 20 may be formed from integrated circuits, thin-film transistor circuits, or other suitable circuitry. Thin-film transistor circuitry may be formed from polysilicon thin-film transistors, semiconducting-oxide thin-film transistors such as indium gallium zinc oxide transistors, or thin-film transistors formed from other semiconductors. Pixels 22 may have color filter elements or other colored structures of different colors (e.g., red, green, and blue) to provide display 14 with the ability to display color images.

Display driver circuitry 20 may include display driver circuits such as display driver circuit 20A and gate driver circuitry 20B. Display driver circuit 20A may be formed from one or more display driver integrated circuits and/or thin-film transistor circuitry (e.g., timing controller integrated circuits). Gate driver circuitry 20B may be formed from gate driver integrated circuits or may be thin-film "gate-on-array" circuitry. Display driver circuit 20A of FIG. 2 may contain communications circuitry for communicating with system control circuitry such as control circuitry 16 of FIG. 1 over path 32. Path 32 may be formed from traces on a flexible printed circuit or other conductive lines. During operation, the control circuitry (e.g., control circuitry 16 of FIG. 1) may supply circuit 20A with information on images to be displayed on display 14.

To display images on display pixels 22, display driver circuitry 20A may supply image data to data lines D while issuing control signals to supporting display driver circuitry such as gate driver circuitry 20B over path 38. Path 38 may, for example, include lines for carrying power signals such as a gate high voltage signal Vgh (which can serve as a maximum gate line signal value output from the gate driver circuitry onto each gate line) and a gate low voltage signal Vgl (which can serve as a ground), control signals such as gate output enable signals, clock signals, etc. Circuitry 20A may supply these signals to gate driver circuitry 20B on one or both edges of display 14 (see, e.g., path 38' and gate driver circuitry 20B' on the right-hand side of display 14 in the example of FIG. 2).

Gate driver circuitry 20B (sometimes referred to as horizontal control line control circuitry) may control horizontal control lines (gate lines) G using the signals received from path 38 (e.g., using the gate high voltage, gate low voltage, gate output enable signals, gate clock signals, etc.). Gate lines G in display 14 may each carry a gate line signal for controlling the pixels 22 of a respective row (e.g., to turn on transistors in pixels 22 when loading data from the data lines into storage capacitors in those pixels from data lines D). During operation, frames of image data may be displayed by asserting a gate signal on each gate line G in the display in sequence. Shift register circuitry (e.g., a chain of gate driver circuits formed from registers and associated output buffers) in gate driver circuitry 20B may be used in controlling the gate line signals.

Figure 3:
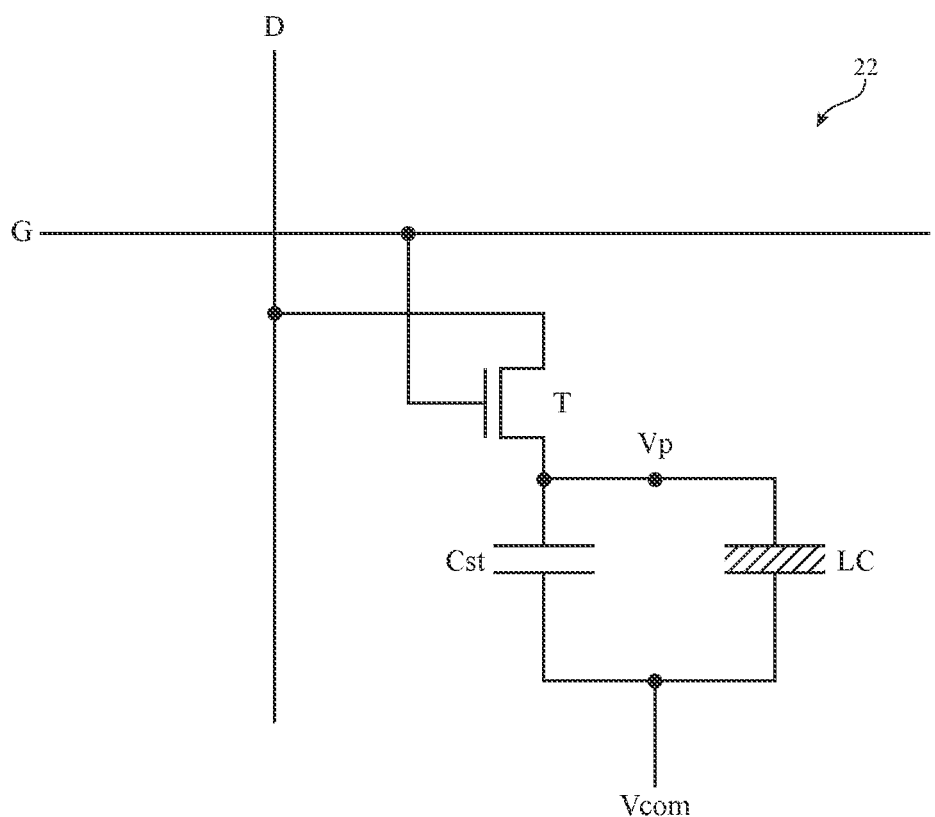
FIG. 3 is a circuit diagram of an illustrative pixel circuit in a display in accordance with an embodiment.

An illustrative pixel circuit for pixels 22 of display 14 is shown in FIG. 3. As shown in FIG. 3, each pixel 22 may include a pixel-sized portion of a liquid crystal layer LC to which electric fields may be supplied using corresponding pixel electrodes. The magnitude of the applied field is proportional to pixel voltage Vp minus common electrode voltage Vcom. During data loading operations, a desired data line signal (i.e., a data voltage Vp that is to be loaded into pixel 22) is driven onto data line D. The gate line signal on gate line G is asserted while the data line signal on data line D is valid. When the gate line signal is asserted, the gate of transistor T is taken high and transistor T is turned on. With transistor T turned on, data from line D is driven onto storage capacitor Cst and establishes pixel voltage Vp. Storage capacitor Cst maintains the value of Vp between successive image frames.

Figure 4:
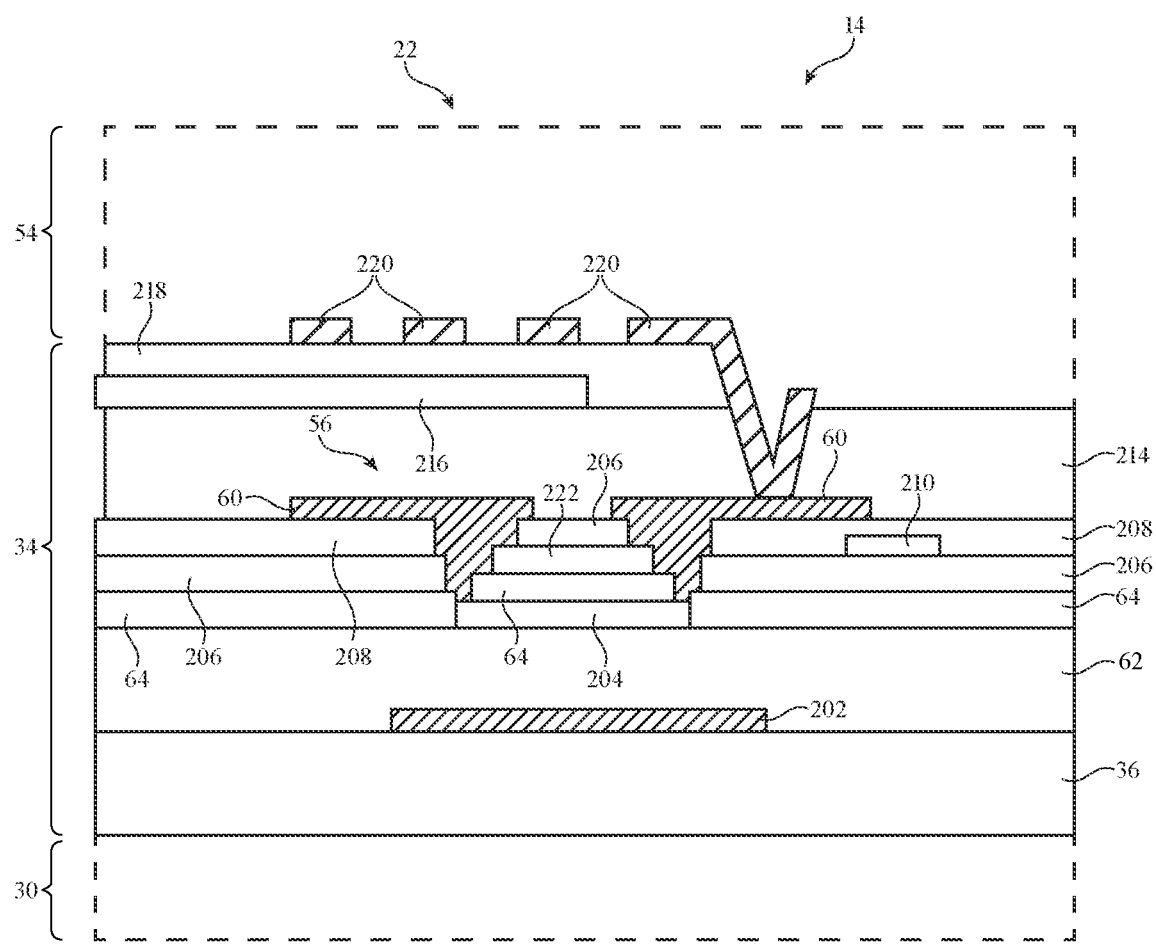
FIG. 4 is a cross-sectional side view of an illustrative display showing the locations of illustrative thin-film layers in accordance with an embodiment.

A cross-sectional side view of a portion of the active area of display 14 is shown in FIG. 4. In region 30, display 14 may have a backlight unit that generates backlight illumination. The backlight illumination passes through thin-film transistor circuitry 34 (sometimes referred to as a thin-film transistor layer), which forms an array of pixels 22. In region 54, display 14 may include a color filter layer and a liquid crystal layer interposed between the color filter layer and thin-film circuitry 34. Layers 54 and thin-film transistor circuitry 34 may be sandwiched between upper and lower polarizers.

Thin-film transistor circuitry 34 may include a substrate layer such as substrate 36. Substrate 36 may be formed from transparent glass, plastic, or other materials. Light shield structure 202 may be formed under thin-film transistors such as illustrative transistor 56. Light shield structure 202 may be formed from metal (as an example). Dielectric buffer layer(s) 62 may be formed on substrate 36. Thin-film transistor circuitry 34 may also include dielectric layers such as gate insulator layer 64 and interlayer dielectric layers 206 and 218. Dielectric layers such as layers 62, 64, 206, and 218 may be formed from silicon oxide, silicon nitride, other inorganic materials, or other insulators. Dielectric planarization layers such as layers 208 and 214 may be formed from organic layers (e.g., polymers) or other insulators.

Conductive layers such as layers 216 and 220 may be formed from indium tin oxide or other transparent conductive material. Layer 220 may be patterned to form electrode fingers for a pixel electrode driven by thin-film transistor 56. Layer 220 may be separated from a common voltage (Vcom) layer formed from layer 216 by interlayer dielectric layer 218. Transistor 56 may have a channel formed from polysilicon layer 204, gate and source terminals formed from metal layer 60, and a gate formed from metal layer 222 (which is separated from the channel by gate insulator 64). Intermediate metal layer 210 may be interposed between interlayer dielectric layer 206 and planarization layer 208 and may be used to form signal interconnects. Other display structures may be formed using the layers of FIG. 4 and/or different thin-film layers may be include in display 14. The illustrative thin-film structures of FIG. 4 are merely illustrative.

In configurations for device 10 in which display 14 has the same number of pixels 22 in each row of display 14, the capacitive loading on the gate lines of display 14 will be relatively even across all of the rows of display 14. In other configurations for display 14 such as the illustrative configuration of FIG. 5, different rows of display 14 may contain different numbers of pixels 22. This may give rise to a row-dependent capacitive loading on the gate lines (e.g., the gate lines carrying signals such as a gate high voltage signal Vgh and gate low voltage signal Vhl) that can affect the resulting brightness of light in the pixels 22 of each row.

Figure 5:
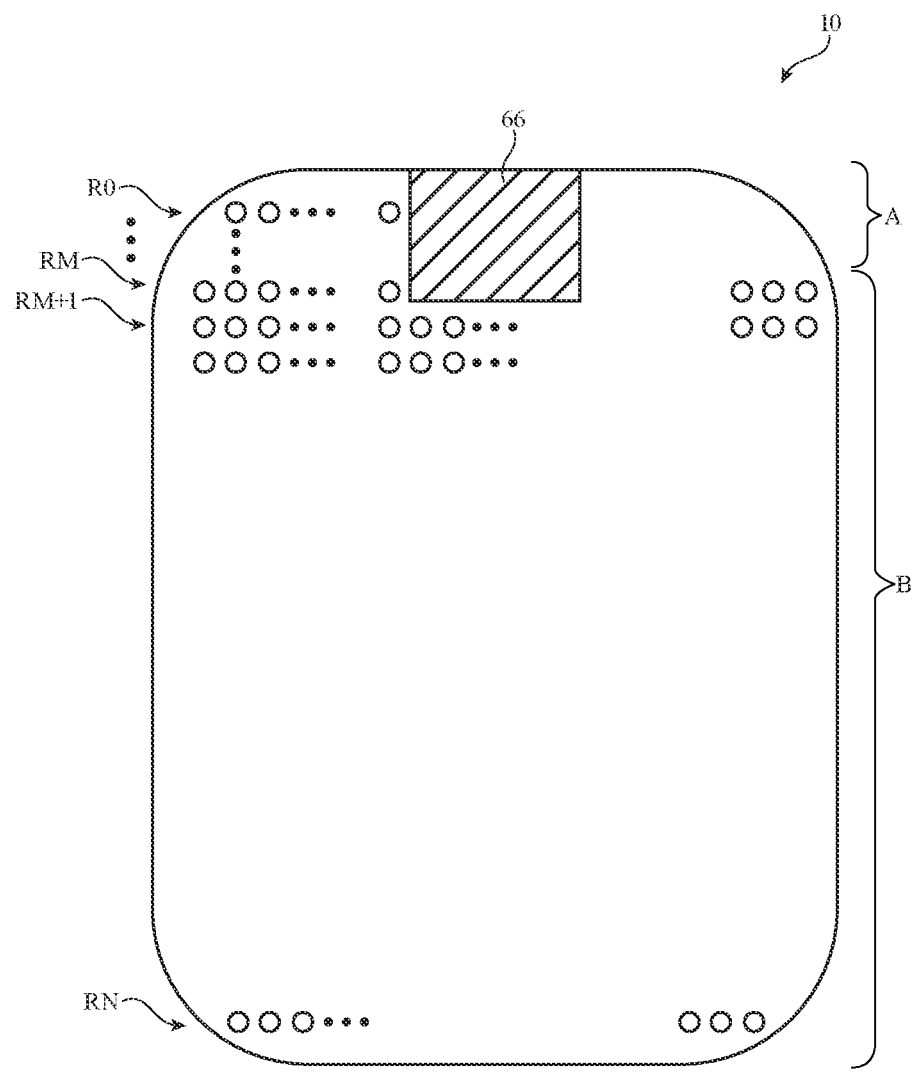
FIG. 5 is a diagram of an illustrative display that has a pixel-free notch along its upper edge and that may have short pixel rows and full-width pixel rows in accordance with an embodiment.

In the illustrative arrangement of FIG. 5, display 14 has a rectangular shape with four curved corners and a recess (i.e., pixel-free notched region 66). The notch interrupts the rows of pixels 22 and creates short rows having fewer pixels than the normal-length rows that span the width of the substrate of display 14. Due to the curved corners of display 14, each row in the top and bottom edge of display 14 will have a slightly different amount of capacitive loading. Due to the gradually curved shape of the peripheral edge of display 14 at the top and bottom edges of display 14, the row-to-row change in the number of pixels 22 that load the gate lines will be gradual in these regions. As a result, luminance variations due to changes in row length (and therefore pixel count) between adjacent rows will be minimal and not noticeable to a viewer of display 14.

More abrupt shape changes such as the changes in display 14 due to notch 66 will introduce more significant changes in pixel loading on the gate lines. Rows such as row RM+1 . . . RN in display 14 of FIG. 5 (sometimes referred to as full-width pixel rows) have pixel counts that are equal (or, in the case of the rows at near the bottom edge of display 14, are nearly equal) to each other. Rows such as rows R0 . . . RM (sometimes referred to as short pixel rows) will have pixel counts that are less than the pixel counts of rows RM+1 . . . RN. This is because the pixels in rows R0 . . . RM will only extend to the left and right boundary of region 66.

Because the gate lines in area A of display 14 (i.e., the gate lines of rows R0 . . . RM in the top edge of display 14 adjacent to region 66) and the gate lines in area B of display 14 (i.e., the gate lines of rows RM+1 . . . RN) experience different amounts of loading in the example of FIG. 5, there is a risk that pixels 22 in areas A and B will be loaded with different voltages on their storage capacitors Cst, even in the presence of identical Vp values on their data lines. Gate line loading affects the shape of the gate line pulses on the gate lines and can therefore affect pixel brightness. Gate lines with larger amounts of gate line loading will tend to be dimmer than gate lines with smaller amounts of gate line loading. Rows in display 14 can be provided with different amounts of gate line loading to help reduce brightness variations. As an example, shorter rows that have fewer pixels can be provided with supplemental loads (sometimes referred to as dummy loads, dummy pixels, or supplemental gate line loading structures) to help make those rows behave similarly to or identically to longer rows in the display.

Figure 6:
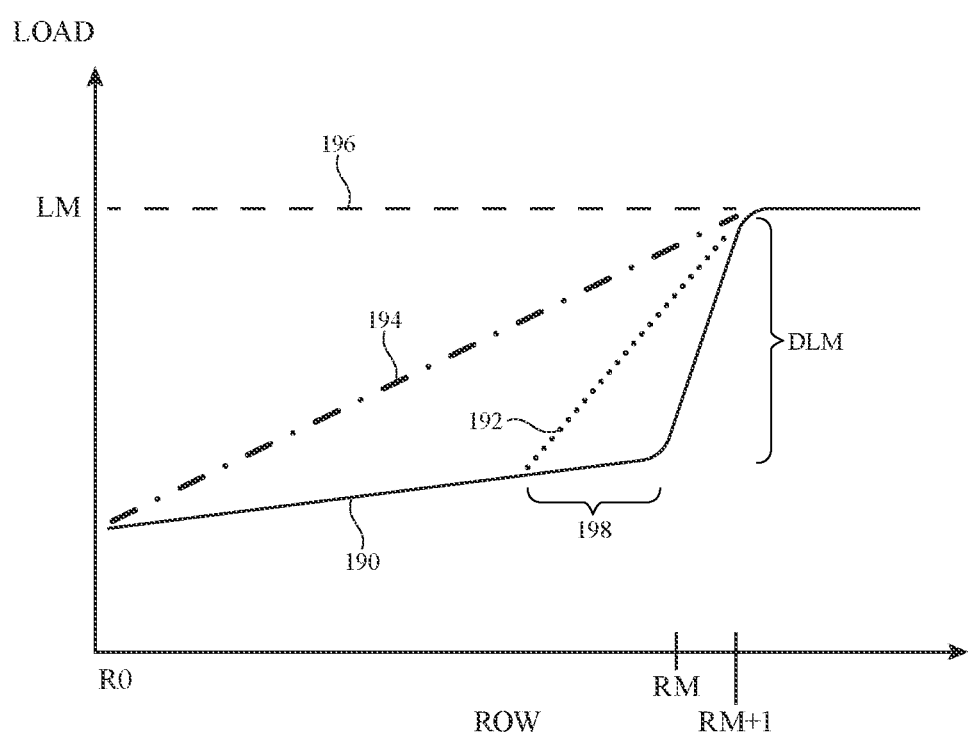
FIG. 6 is a graph showing how gate line loading may be adjusted as a function of row position in a display to help minimize display brightness variations in accordance with an embodiment.

A graph illustrating the impact of various loading schemes that may be used to help smooth out brightness variations in a display having rows of pixels of unequal lengths (different numbers of pixels) is shown in FIG. 6. In the example of FIG. 6, gate line loading (LOAD) has been plotted as a function of row number (e.g., for the upper portion of display 14 starting at row R0 of FIG. 5). Solid line 190 corresponds to a display having the shape shown in FIG. 5 but without any supplemental loading structures. Row R0 to row RM (i.e., rows in area A of FIG. 5) experience gradually increasing amounts of loading. From row RM+1 to row RN (i.e., in area B), loading reaches load value LM. With an uncompensated display configuration (solid line 190), there may be a relatively sharp discontinuity (loading difference DLM) in the amount of loading experienced by the gate lines of respective rows RM and row RM+1. This discontinuity can lead to a noticeable variation between the brightness of the pixels in row RM and the brightness of the pixels in row RM+1.

Brightness variations such as these can be smoothed out by adding supplemental gate line loading structures to appropriate rows of display 14. With one illustrative arrangement, which is illustrated by line 192, gate line loading is smoothed out by adding supplemental loads to the gate lines of rows 198. If desired, further smoothing may be achieved (e.g., by adding varying amounts of load to each of the gate lines of rows R0 through RM, as illustrated by line 194). If desired, gate lines in rows RO-RM may be compensated by adding sufficient supplemental gate line loading to equalize the loading on the gate lines of all of the rows in display 14 (see, e.g., illustrative loading line 196 of FIG. 6). In general, any suitable amount of supplemental loading may be added to appropriate rows of display 14. Supplemental loads may be significant (e.g., to completely equalize loading for all rows as illustrated by line 196), may be moderate (e.g., to smooth loading as shown by line 194), or may be relatively small (e.g., to help smooth out the load discontinuity at rows RM/RM+1 by adding loading to a relatively modest number of rows (e.g., rows 198), as illustrated by line 192. Any of these schemes may also be combined with row-dependent gate signal shaping schemes to help smooth out brightness discontinuities.

Illustrative arrangements for adding supplemental loads to shorter pixel rows of display 14 are shown in FIGS. 7-16

Figure 7:
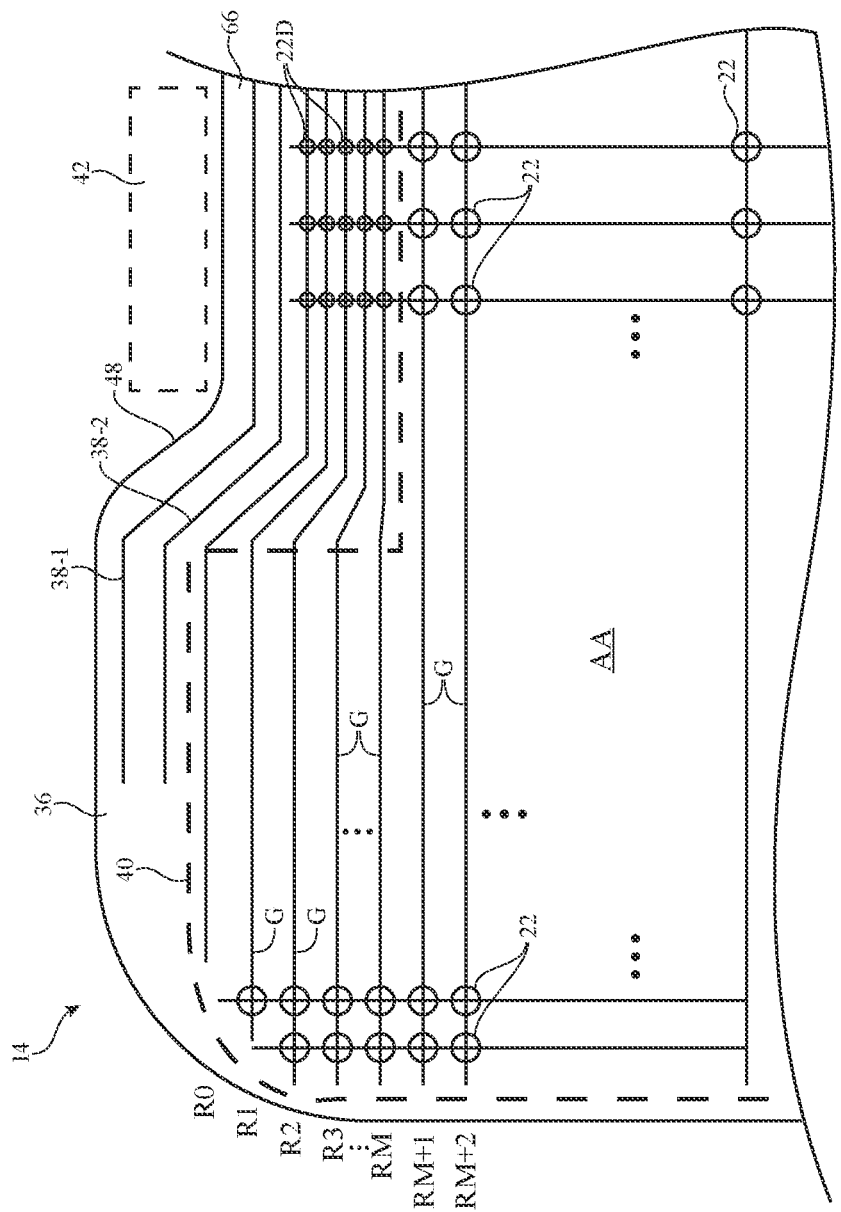
FIG. 7 is a top view of a portion of an illustrative display showing how supplemental gate line loading structures such as dummy pixel structures may be added to rows in a display to even out brightness variations in accordance with an embodiment.

As shown in the illustrative configuration of FIG. 7, display 14 may have an active region such as active region 40 (i.e., active area AA within boundary line 40) where pixels 22 are located. Display 14 may also have a pixel-free notch region such as region 66 outside of active area 40 that is free of light-emitting pixels 22. Display 14 may have one or more substrate layers such as substrate 36. Substrate 36 may have an edge such as edge 48. Edge 48 may be straight or curved (as in the example of FIG. 7).

The gate lines of pixel rows RO-RM may extend across active area 40 and across notch-region 66 (sometimes referred to as an inactive area or inactive notch region of display 14). The pitch of gate lines G in inactive region 66 may be smaller than the pitch of gate lines G within active area 40. The reduced pitch of gate lines G in inactive region 66 provides a space such as space 42 at the top of display 14. Space 42 may be used to accommodate one or more electronic components (e.g., input-output components such as a camera, a speaker, an ambient light sensor, a proximity sensor, and/or other input-output components).

Selected gate lines G (e.g., gate lines in pixel rows RO-RM or other suitable gate lines) may be coupled to supplemental loading structures (supplemental gate line loading structures) such as dummy pixels 22D in notch region 66. Any suitable number of pixel rows may be supplied with supplemental loading (e.g., 2-20 rows, 2-100 rows, 50-1000 rows, more than 25 rows, fewer than 2000 rows, etc.). Any suitable number of dummy pixels 22D (e.g., 1-1000, more than 10, fewer than 500, etc.) may be coupled to the gate line Gin each row of display 14 and/or may be coupled to other suitable horizontal control lines in display 14 to reduce row-dependent brightness variations.

Dummy pixels 22D may contain all or some of the pixel circuitry of regular pixels 22 with modifications that prevent these pixels from emitting light. Examples of modifications that may be made to convert active pixels 22 into dummy pixels 22D include: omitting the liquid crystal material of pixels 22 from pixels 22D, omitting the anodes of pixels 22D, omitting small portions of metal traces to create open circuits, etc. The footprint (outline when viewed from above) of each of pixels 22D of FIG. 7 may be the same as the footprint of each of pixels 22 or pixels 22 and dummy pixels 22D may have different footprints.

Figure 8:
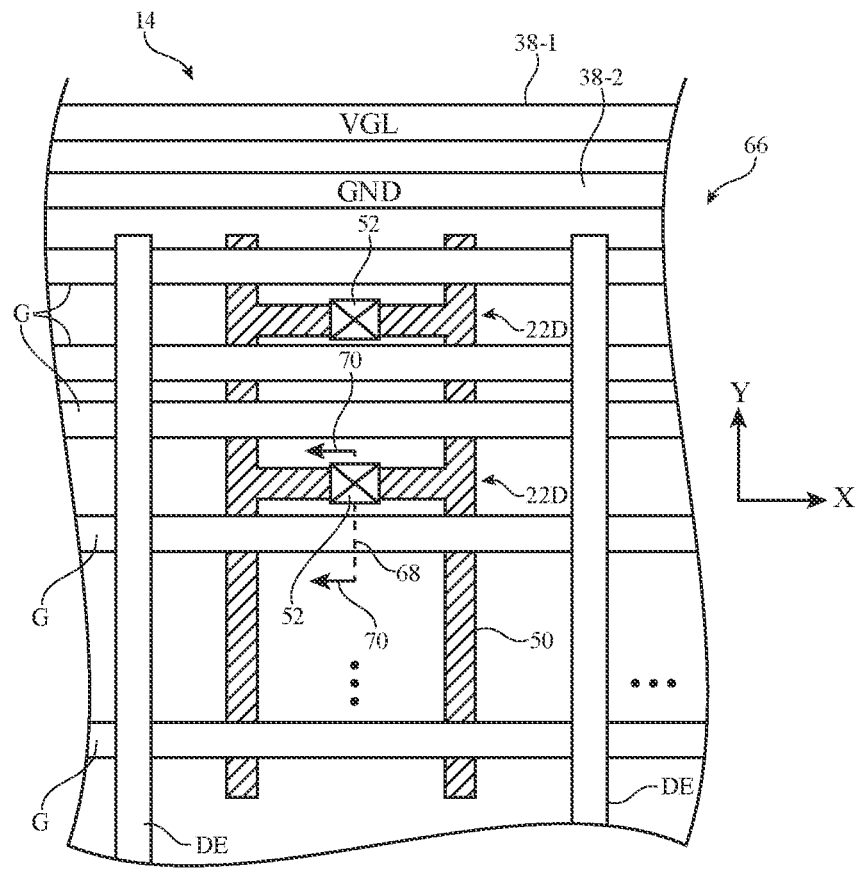
FIG. 8 is a top view of a portion of an illustrative display showing how data line extensions and polysilicon loading structures may be used to increase gate line loading in accordance with an embodiment.

If desired, supplemental loading structures formed from one or more capacitors in region 66. This type of arrangement is shown in FIG. 8. FIG. 8 is a top view of illustrative supplemental loading structures that may be used in notch region 66 of FIG. 6. In this example, supplemental loading structures 22D include data line extensions DE (e.g., portions of data lines D of FIG. 7 that extend into notch region 66) and conductive layer 50. A first set of capacitors may be formed in areas of overlap between data line extensions DE and gate lines G (e.g., data line extensions DE may form a first electrode in each capacitor and gate lines G may form a second electrode in each capacitor). A second set of capacitors may be formed in areas of overlap between conductive layer 50 and gate lines G (e.g., conductive layer 50 may form a first electrode in each capacitor and gate lines G may form a second electrode in each capacitor). One or more dielectric layers may separate gate lines G from data line extensions DE and conductive layer 50.

The dielectric material between data line extensions DE and gate lines G and between conductive layer 50 and gate lines G may be formed from one or more layers of inorganic and/or organic dielectric material in display 14. Conductive layer 50 may be formed from metal layers, conductive semiconductor layers (e.g., doped polysilicon, etc.), or other conductive layers. For example, conductive layer 50 may be formed from conductive layers such as a first gate metal layer, second gate metal layer, source-drain metal layer, silicon layer, or other suitable conductive layers in the thin-film transistor circuitry of display 14. In one illustrative arrangement, which is sometimes described herein as an example, conductive layer 50 may be formed from a doped polysilicon layer such as doped polysilicon layer 204 of FIG. 4.

If desired, the amount of overlap between data line extensions DE and gate lines G in each dummy pixel 22D may match the amount of overlap between data lines D and gate lines G in light-emitting pixels 22. This ensures that data line extensions DE provide the same or similar capacitive loading to gate lines G in inactive region 66 that data lines D provide to gate lines G in active area 40 of display 14. Similarly, the amount of overlap between conductive layer 50 (e.g., a layer of doped polysilicon) and gate lines Gin dummy pixels 22D may match the amount of overlap between polysilicon layer 204 and gate lines G in pixels 22. This ensures that polysilicon layer 50 provides the same or similar capacitive loading to gate lines G in inactive region 66 that polysilicon layer 204 in pixels 22 provide to gate lines G in active region 40 of display 14.

Polysilicon layer 50 in inactive region 66 may be formed from the same layer of material that forms polysilicon layer 204 in active region 40, but polysilicon layer 50 may be electrically isolated from polysilicon layer 204. Thus, in order to provide the appropriate voltage to polysilicon layer 50, polysilicon layer 50 may be coupled to a bias voltage supply line such as a ground line (e.g., ground line 38-2) or other signal line (e.g., gate low voltage Vgl signal line 38-1).

In one illustrative arrangement, vias such as vias 52 may be used to couple polysilicon layer 50 to a common voltage (Vcom) layer. The Vcom layer may in turn be coupled to ground line 38-2 to provide polysilicon layer 50 with the appropriate bias voltage.

In the example of FIG. 8, each supplemental loading structure 22D has an H-shape and is used to increase loading on two adjacent gate lines G. The upper half of each H-shape loading structure 22D (e.g., the two vertical portions extending parallel to the y-axis of FIG. 8) crosses a first gate line G at two locations, and the lower half of each H-shape loading structure 22D (also extending parallel to the y-axis of FIG. 8) crosses a second gate line at two locations. The horizontal portion of each H-shape loading structure (e.g., the segment extending parallel to the x-axis of FIG. 8) is coupled to via 52 to bias the polysilicon 50 in each loading structure 22D.

Figure 9:
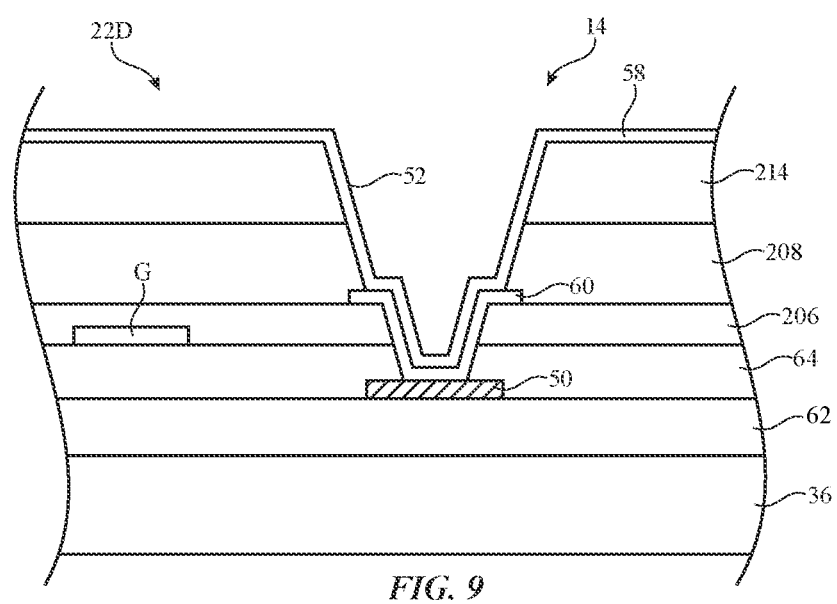
FIG. 9 is a cross-sectional side view of the display of FIG. 8 showing how polysilicon loading structures may be biased using a common voltage electrode layer in accordance with an embodiment.

FIG. 9 shows a cross-section of supplemental loading structure 22D of FIG. 8 taken along line 68 and viewed in direction 70. As shown in FIG. 9, polysilicon layer 50 may be located on buffer layers 62 on substrate 36. Gate insulator 64 may be formed over buffer layer 62. Gate lines G (e.g., formed from metal layer 222 of FIG. 4) may be formed on top of gate insulator 64. Interlayer dielectric layer 206 and planarization layers 208 and 214 may be formed over gate lines G. A conductive layer such as conductive layer 58 may be formed over dielectric layers 206, 208, and 214. Conductive layer 58 may be formed from the same layer of transparent conductive material that forms the common electrode layer in pixels 22 (e.g., layer 58 may be formed from ITO 216 of FIG. 4). Since conductive layer 58 is formed from the same layer as common electrode 216 of active area 40, layer 58 is sometimes referred to as a common voltage (Vcom) layer. However, layer 58 need not be electrically coupled to the Vcom layer of pixels 22. Rather, layer 58 may be electrically isolated from the Vcom layer of pixels 22 and may instead be coupled to a ground line (e.g., ground line 38-2 of FIG. 8).

Gate insulator 64 and dielectric layers 206, 208, and 214 may include openings for vias 52. For example, as shown in FIG. 9, layers 64, 206, 208, and 214 include an opening that aligns with polysilicon layer 50 for allowing via 52 to electrically couple common electrode layer 58 to polysilicon layer 50. This allows common electrode layer 58 to provide a bias voltage to polysilicon layer 50. If desired, an optional metal layer such as metal layer 60 may be electrically coupled between polysilicon layer 50 and common voltage layer 58.

Figure 10:
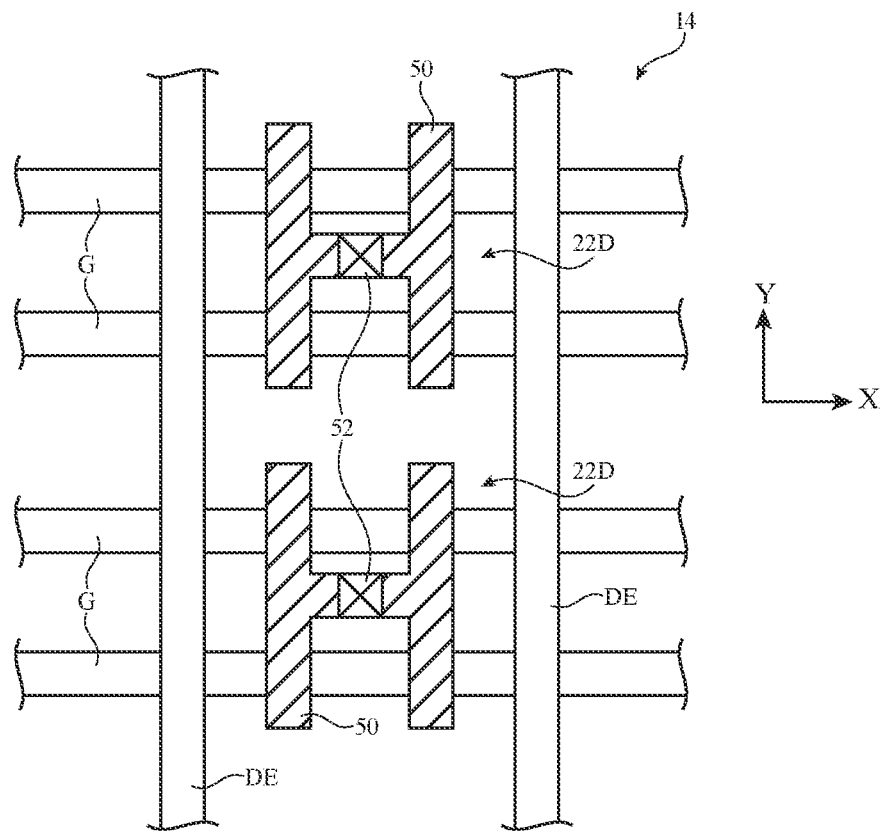
FIG. 10 is a top view of a portion of an illustrative display showing how adjacent pairs of gate lines may have separate polysilicon loading structures in accordance with an embodiment.

The example of FIG. 8 in which supplemental loading structures 22D are coupled to adjacent loading structures 22D in the same column is merely illustrative (e.g., in which the vertical portions of polysilicon 50 extend continuously parallel to the x-axis across multiple loading structures 22D). If desired, polysilicon 50 in each loading structure 22D may be isolated from polysilicon 50 in adjacent loading structures 22D. This type of arrangement is illustrated in FIG. 10. As shown in FIG. 10, polysilicon 50 has an H-shape in each loading structure 22D but is not connected to adjacent polysilicon 50 in the next row or column of loading structures 22D.

Figure 11:
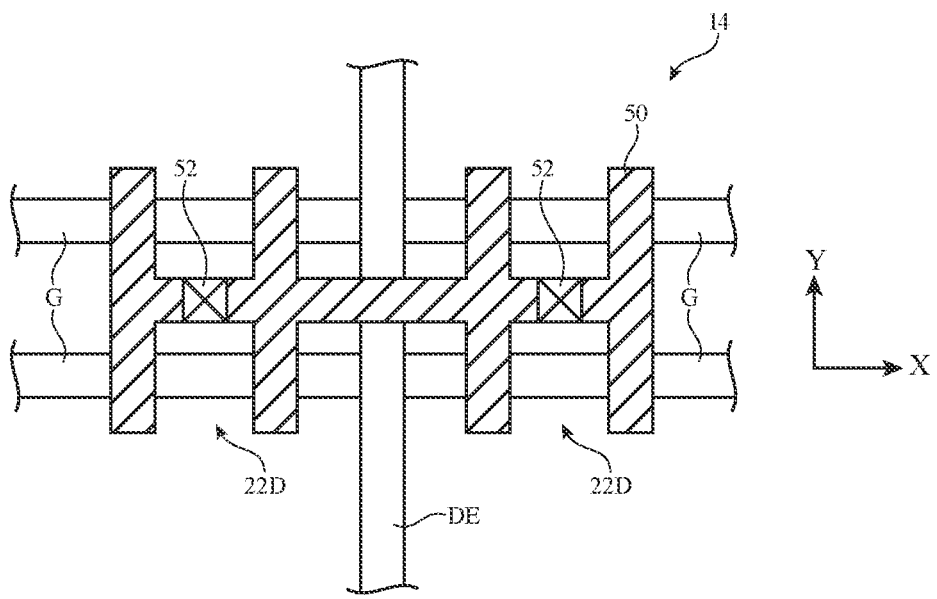
FIG. 11 is a top view of a portion of an illustrative display showing how a pair of gate lines may have coupled polysilicon loading structures in accordance with an embodiment.

FIG. 11 illustrates an example in which the horizontal portions of polysilicon 50 extend continuously across multiple loading structures 22D in the same row. Loading structures 22D in the same column may be separated from one another (as shown in the example of FIG. 10) or may be coupled together (as shown in the example of FIG. 8).

In arrangements where dummy polysilicon layer 50 is biased using a ground loop such as ground loop 38-2, it may be desirable to form the ground loop from multiple metal layers to avoid damage to dummy loading structures 22D during manufacturing. If ground loop 38-2 is formed entirely from one metal layer such as metal 222, this could cause polysilicon 50 to absorb charge as the remaining layers in display 14 are formed, which in turn could cause damage to loading structures 22D. To avoid excess charge being absorbed by polysilicon 50, ground loop 38-2 may be formed from alternating segments of different metal layers. This type of shown in FIG. 12.

Figure 12:
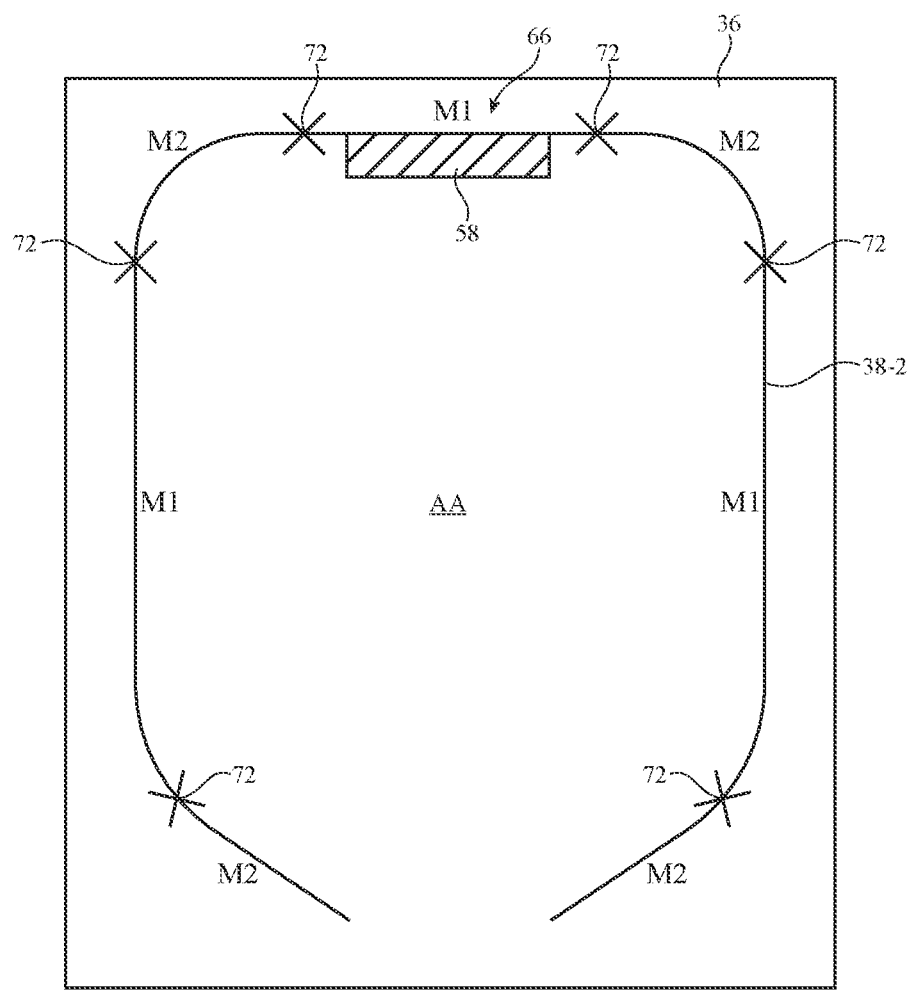
FIG. 12 is a top view of an illustrative display showing how a ground loop may be formed from segments of different metal layers in accordance with an embodiment.

As shown in FIG. 12, ground loop 38-2 may be formed from alternating segments of different metal layers such as M1 (e.g., layer 222 of FIG. 4) and M2 (e.g., layer 60 of FIG. 4). During fabrication, M1 may be deposited and patterned to form discrete segments. The segments may be separated from one another so as not to form a complete loop. Metal layer M1 may be broken up into two, three, four, or more than four separate segments. A second metal layer such as metal layer M2 may be used to complete the loop. Second metal layer M2 and first metal layer M1 may be coupled to one another at locations 72 to form a continuous conductive loop. A portion of ground loop 38-2 may be coupled to common voltage layer 58 (e.g., the portion of Vcom layer 216 that is formed in inactive area 66), which is in turn coupled to polysilicon 50 to bias polysilicon 50 at the desired voltage. The example of FIG. 12 in which ground loop 38-2 is formed from metal layers M1 and M2 is merely illustrative. If desired, other metal layers such as metal layer M3 may be used to form ground loop 38-2 (e.g., metal layer M3 may be used in place of M1, may be used in place of M2, or may be used in addition to M1 and M2 to form ground loop 38-2).

Figure 13:
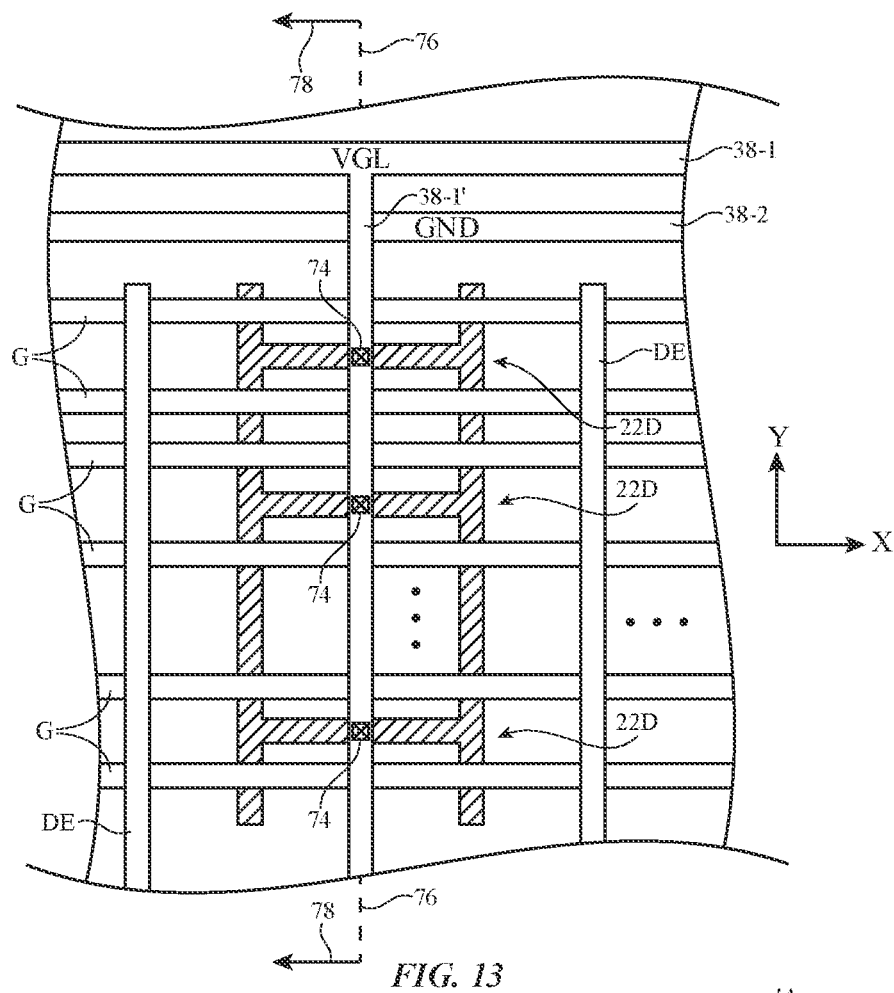
FIG. 13 is a top view of an illustrative display showing how polysilicon loading structures may be biased using a voltage gate low line in accordance with an embodiment.

The example of FIGS. 8 and 9 in which common voltage layer 58 (e.g., a conductive layer in inactive region 66 that is formed from the same layer as Vcom layer 216 of FIG. 4 but that is electrically isolated from the Vcom layer in active area 40 of display 14) is used to bias polysilicon 50 in region 66 is merely illustrative. If desired, other conductive layers of display 14 may be used to bias polysilicon 50. FIG. 13 illustrates an example in which polysilicon 50 is biased using an extended portion of signal line 38-1 (e.g., a gate low voltage line).

As shown in FIG. 13, gate low voltage line 38-1 may have vertical segments (e.g., segments extending parallel to the y-axis of FIG. 13) such as vertical segment 38-1'. Vertical segments 38-1' may extend across multiple rows of dummy loading structures 22D. Vias such as vias 74 may be used to electrically couple the horizontal segment in each loading structure 22D to signal line 38-1. Gate low voltage line 38-1 may, if desired, be formed from second metal layer 60 of FIG. 4 and may receive signals from driver circuitry in display 14 (e.g., display driver circuitry 20A and/or gate driver circuitry 20B of FIG. 2).

Figure 14:
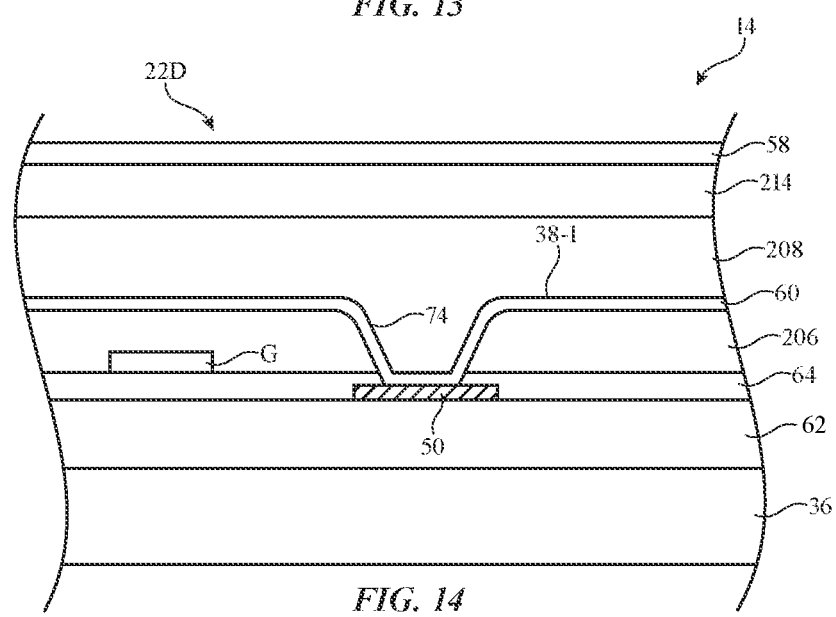
FIG. 14 is a cross-sectional side view of the display of FIG. 13 showing how a voltage gate low line may be electrically coupled to a polysilicon loading structure in accordance with an embodiment.

FIG. 14 is a cross-sectional side view of supplemental loading structure 22D of FIG. 13 take along line 76 and viewed in direction 78. As shown in FIG. 14, polysilicon layer 50 may be located on buffer layers 62 on substrate 36. Gate insulator 64 may be formed over buffer layer 62. Gate lines G (e.g., formed from metal layer 222 of FIG. 4) may be formed on top of gate insulator 64. Interlayer dielectric layers 206 and planarization layers 208 and 214 may be formed over gate lines G. A conductive layer such as conductive layer 58 may be formed over planarization layer 214. Conductive layer 58 may be formed from the same layer of transparent conductive material that forms the common electrode layer in pixels 22 (e.g., layer 58 may be formed from common electrode layer 216 of FIG. 4). However, layer 58 need not be electrically coupled to the Vcom layer of pixels 22. Rather, layer 58 may be electrically isolated from layer 58 and may instead be coupled to a ground line (e.g., ground line 38-2 of FIG. 13). A metal layer such as metal layer 60 may be located between interlayer dielectric layer 206 and planarization layer 208 and may be used to form gate low voltage line 38-1.

Gate insulator 64 and dielectric layer 206 may include openings for vias 74. For example, as shown in FIG. 14, layers 64 and 206 include an opening that aligns with polysilicon layer 50 for allowing via 74 to electrically couple gate low voltage line 38-1 (i.e., metal layer 60) to polysilicon layer 50. This allows gate low voltage line 38-1 to provide a bias voltage to polysilicon layer 50.

Figure 15:
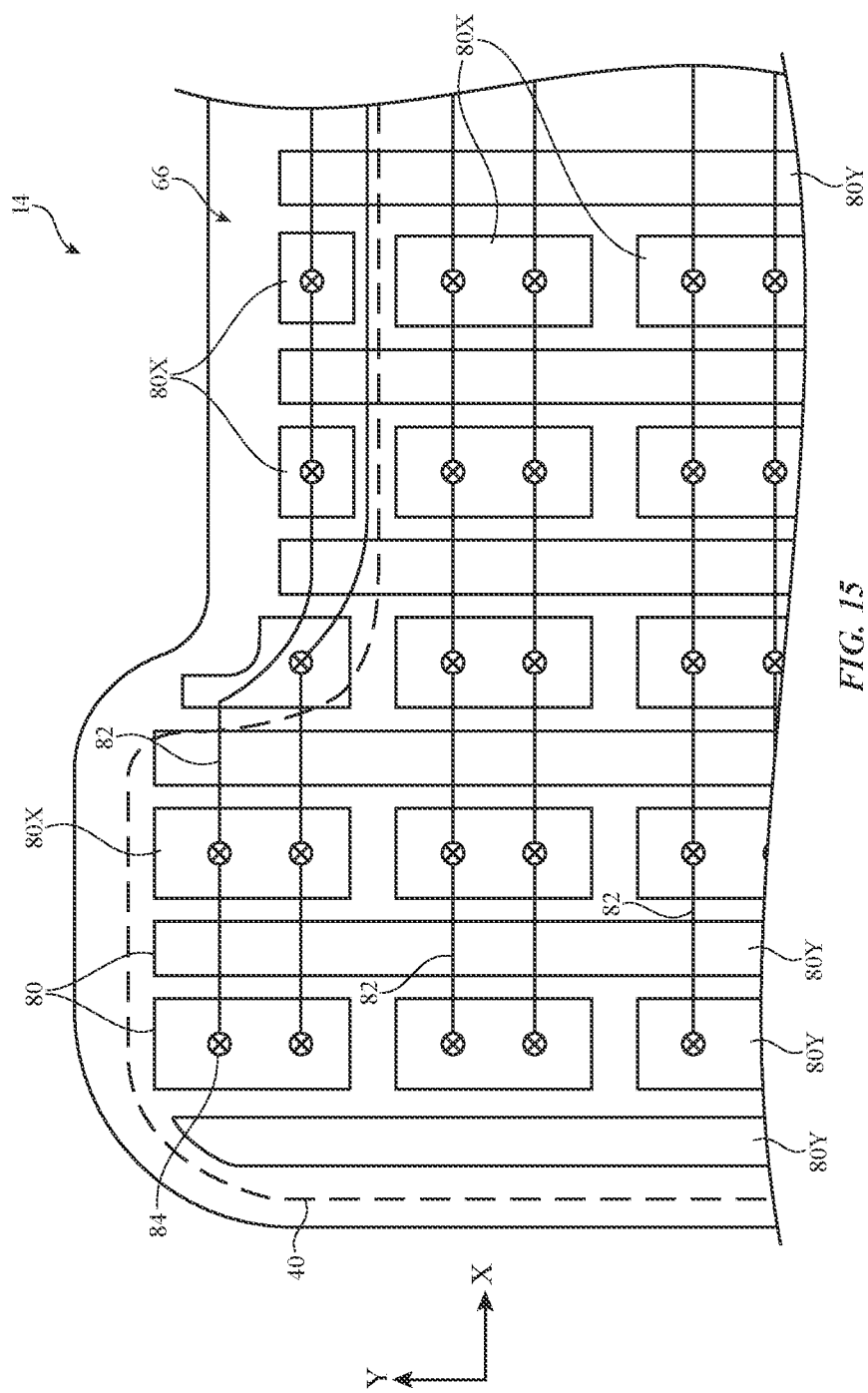
FIG. 15 is a top view of an illustrative display showing how supplemental loading structures may be used to increase the loading on signal lines that are coupled to short rows of common electrode pads in accordance with an embodiment.

In some arrangements, display 14 may include an integrated touch sensor. Touch sensor structures may, for example, be integrated into thin-film transistor circuitry of the type shown in FIG. 4. With this type of arrangement, the common voltage layer in display 14 may be segmented to support both display and touch functionality. An illustrative layout that may be used in implementing a segmented Vcom layer for supporting display and touch functionality is shown in FIG. 15. As show in FIG. 15, display 14 may include Vcom conductor structures 80 such as rectangular Vcom pads 80X that are interconnected using conductive Vcom jumpers 82 to form Vcom rows (called Vcomr). Vcom jumpers 82 (sometimes referred to as XVcom lines) may, for example, be formed from metal layer 210 of FIG. 4 or may be formed from other conductive materials in display 14. Vias such as vias 84 may be used to electrically couple lines 82 to Vcomr pads 80X.

Vertical Vcom conductors such as Vcom columns 80Y (called Vcomc) may be interspersed with pads 80X. The Vcomr and Vcomc conductors of FIG. 15 may be formed from indium tin oxide (e.g., layer 216 of FIG. 4) or other transparent conductive material and may be used for supporting both display and touch functions in display 14. For example, a time division multiplexing scheme may be used to allow the Vcom conductive structures to be used both as ground plane structures for pixels 22 (during display mode operations) and as touch sensor electrodes (during touch sensor mode operations).

When pixels 22 of display 14 are being used to display an image on display 14, display driver circuitry 20A (FIG. 2) may, for example, short both Vcomr 80X and Vcomc 80Y to a ground voltage such as 0 volts or other suitable voltage (e.g., a fixed reference voltage). In this configuration, the Vcomr 80X and Vcomc 80Y conductors may work together to serve as a part of a common ground plane (conductive plane) for pixels 22 of display 14. Because Vcomr 80X and Vcomc 80Y are shorted together when displaying images in this way, no position-dependent touch data is gathered.

At recurring time intervals, the image display functions of display 14 may be temporarily paused so that touch data can be gathered. During these time intervals (sometimes referred to as display blanking intervals), the display may operate in touch sensor mode. When operating in touch sensor mode, the Vcomr 80X and Vcomc 80Y conductors may be operated independently, so that the position of a touch event can be detected in dimensions X and Y. There are multiple Vcom rows (formed from Vcomr pads 80X) which allows discrimination of touch position with respect to dimension Y. There are also multiple Vcom columns (formed from Vcomc 80Y), which allows touch position to be determined in dimension X.

In arrangements where display 14 has an inactive notch area such as notch region 66, there may be rows of gate lines (not shown) with fewer pixels than other rows of display 14 (as discussed in connection with FIG. 7). To avoid brightness variations that can occur from different gate line loading effects, any one or more of the gate line loading structures discussed in connection with FIGS. 5-14 may be used in display 14 of FIG. 15.

In arrangements where touch sensor electrodes are incorporated into the thin-film transistor circuitry of display 14, as in the example of FIG. 15, notch region 66 may also interrupt the rows of touch sensor electrodes (i.e., the rows of Vcomr pads 80X). This creates short rows of Vcomr pads 80X having fewer Vcomr pads 80X than the normal-length rows that span the width of the substrate of display 14. If care is not taken, XVcom lines 82 in short rows of Vcomr pads 80X (e.g., the rows of Vcomr pads 80X on either side of notch 66) may experience different amounts of loading than XVcom lines 82 in full-width rows of Vcomr pads 80X (e.g., the rows of Vcomr pads 80X below notch 66), which in turn can lead to different Vcomr coupling voltages and recovery times when pixel data sampling. This type of pixel data sampling error can lead to different luminance values for pixels in the short rows and pixels in the full-width rows, which can cause visible mura.

To reduce loading mismatch in XVcom lines 82 of display 14, short rows of Vcomr pads 80X may be provided with supplemental loads (sometimes referred to as dummy loads, dummy pixels, or supplemental gate line loading structures) to help make those Vcomr rows behave similarly to or identically to longer Vcomr rows in the display.

Figure 16:
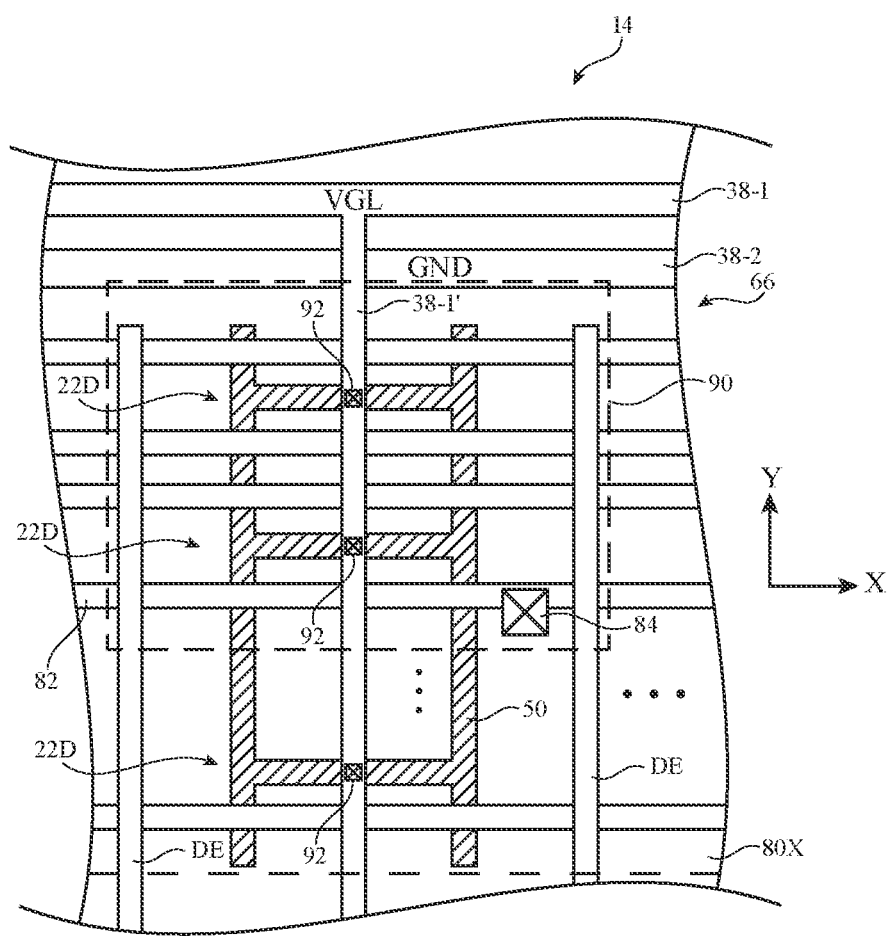
FIG. 16 is a top view of the display of FIG. 15 showing how polysilicon loading structures may be used to increase the loading on gate lines in short pixel rows and transparent electrode loading structures may be used to increase the loading on short rows of common electrode pads in accordance with an embodiment.

FIG. 16 is a top view of illustrative dummy loading structures that may be used in notch region 66 of FIG. 15. As shown in FIG. 16, display 14 may include dummy pixels 22D for increasing the loading on gate lines G in notch region 66 (e.g., supplemental loading structures of the type described in FIGS. 5-14). Dummy pixels 22D may include data line extensions DE and conductive layer 50. Data line extensions DE provide the same or similar capacitive loading to gate lines G in inactive region 66 that data lines DE provide to gate lines G in active area 40 of display 14. Similarly, conductive layer 50 (e.g., a layer of polysilicon) provides the same or similar capacitive loading to gate lines G in inactive region 66 that polysilicon layer 204 (FIG. 4) in pixels 22 provide to gate lines G in active region 40 of display 14.

Polysilicon layer 50 in inactive region 66 may be formed from the same layer of material that forms polysilicon layer 204 in active region 40, but polysilicon layer 50 may be electrically isolated from polysilicon layer 204. Thus, in order to provide the appropriate voltage to polysilicon layer 50, polysilicon layer may be coupled to a bias voltage supply line such as gate low voltage (Vgl) signal line 38-1. Gate low voltage line 38-1 may have vertical segments (e.g., segments extending parallel to the y-axis of FIG. 16) such as vertical segment 38-1'. Vertical segments 38-1' may extend across multiple rows of dummy loading structures 22D. Vias such as vias 92 may be used to electrically couple the horizontal segment in each loading structure 22D to signal line 38-1. Gate low voltage line 38-1 may, if desired, be formed from second metal layer 60 of FIG. 4 and may receive signals from driver circuitry in display 14 (e.g., display driver circuitry 20A and/or gate driver circuitry 20B of FIG. 2), if desired.

Additional dummy loading structures, sometimes referred to as Vcom row loading structures, may be used to increase loading on XVcom lines 82 in short rows of Vcomr pads 80X. Vcom row loading structures may include, for example, conductive electrodes 90. Each conductive electrode 90 may overlap a respective one of Vcomr pads 80X. The use of electrodes 90 over respective Vcomr pads 80X creates capacitors that increase the capacitive loading on XVcom lines 82 near notch 66 to match or more closely match the capacitive loading on XVcom lines 82 below notch 66. Each capacitor includes a first electrode formed from conductive layer 90 and a second electrode formed from Vcomr pad 80X. One or more dielectric layers may separate pads 80X from conductive layer 90. The dielectric material between pads 80X and conductive layer 90 may be formed from one or more layers of inorganic and/or organic dielectric material in display 14. Conductive layer 90 may be formed from metal layers, conductive semiconductor layers (e.g., doped polysilicon, etc.), or other conductive layers. For example, conductive layer 90 may be formed from conductive layers such as a first gate metal layer, second gate metal layer, source-drain metal layer, silicon layer, or other suitable conductive layers in the thin-film transistor circuitry of display 14.

In one illustrative arrangement, which is sometimes described herein as an example, conductive electrodes 90 may be formed from the same layer of transparent conductive material that forms pixel electrodes in active area 40 (e.g., conductive electrodes 90 may be formed from pixel electrode layer 220 of FIG. 4). Since electrode 90 is formed from the same layer as pixel electrode layer 220 of active area 40, layer 90 is sometimes referred to as a pixel ITO layer. However, electrode 90 need not be electrically coupled to the pixel electrodes of pixels 22. Rather, electrodes 90 may be electrically isolated from the pixel ITO of pixels 22. Thus, in order to provide the appropriate voltage to conductive layer 90, electrodes 90 may be coupled to a bias voltage supply line such as gate low voltage (Vgl) signal line 38-1 or ground line 38-2. Vias may be used to couple respective electrodes 90 to the appropriate bias voltage supply line (e.g., line 38-1 or line 38-2).

The capacitor formed from Vcomr pad 80X and conductive electrode 90 may increase the capacitive loading on XVcom lines 82 in the short rows of Vcomr pads 80X to match or more closely match the capacitive loading on XVcom lines 82 in the full-width rows of Vcomr pads 80X. As shown in FIG. 16, Vcom row loading structures 90 may be used in combination with gate line loading structures (e.g., polysilicon 50 and data line extensions DE) to reduce luminance differences between short-pixel rows (e.g., row RO–RM of FIG. 7) and full-width pixel rows (e.g., row RM+1 and below).

If desired, electrodes 90 may also be formed over the portions of column Vcomc electrodes 80Y that extend into inactive notch area 66. Since XVcom lines 82 also overlap the portions of Vcomc electrodes 80Y in inactive area 66 (see FIG. 15), the capacitor formed from electrodes 90 and Vcomc electrodes 80Y in inactive area 66 may be used to further increase the capacitive loading on XVcom lines 82 in short Vcomr rows.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    an array of pixels that form an active display area, wherein the array of pixels includes first and second groups of pixels in a row;
    an input-output component located in an inactive display area that separates the first group of pixels from the second group of pixels;
    signal paths and control lines coupled to the array of pixels, wherein the signal paths are orthogonal to the control lines and wherein the control lines include a first control line that is coupled to the first and second groups of pixels in the row and that extends across the inactive display area; and
    a loading structure in the inactive display area having first and second connected segments that overlap the first control line at respective first and second locations to increase loading on the first control line.

2. The display defined in claim 1 wherein the input-output component is selected from the group consisting of: a camera, a speaker, an ambient light sensor, and a proximity sensor.

3. The display defined in claim 1 wherein the signal paths comprise data lines and the control lines comprise gate lines.

4. The display defined in claim 1 wherein the inactive display area is pixel-free.

5. The display defined in claim 1 wherein the loading structure comprises polysilicon.

6. The display defined in claim 1 wherein the array of pixels comprises a common electrode that couples the loading structure to a bias voltage supply line.

7. The display defined in claim 1 wherein the loading structure comprises first and second orthogonal segments.

8. The display defined in claim 1 further comprising a metal layer that couples the loading structure to a bias voltage supply line.

9. The display defined in claim 8 wherein the metal layer and the signal paths are formed from the same material.

10. The display defined in claim 1 wherein the signal paths include a first signal path that extends from the active display area into the inactive display area and that overlaps the first control line to increase loading on the first control line.

11. The display defined in claim 1 wherein the control lines have a reduced pitch in the inactive display area.

12. A display, comprising:
    an array of pixels;
    a pixel-free region that protrudes into the array of pixels and that separates a first group of pixels from a second group of pixels;
    a camera located in the pixel-free region;
    control lines coupled to the array of pixels, wherein the control lines include a first group of control lines that are coupled to the first and second groups of pixels and that extend across the pixel-free region and wherein the first group of control lines have a reduced pitch in the pixel-free region; and
    a loading structure in the pixel-free region that overlaps the first group of control lines to increase loading on the first group of control lines, wherein the loading structure comprises first and second connected segments that extend orthogonal to the control lines.

13. The display defined in claim 12 wherein the loading structure comprises polysilicon and is coupled to a bias voltage supply line.

14. The display defined in claim 13 wherein the array of pixels comprises a transparent conductive layer that forms a common electrode and that couples the loading structure to the bias voltage supply line.

15. The display defined in claim 12 further comprising signal paths that are coupled to the array of pixels and that are orthogonal to the control lines, wherein the signal paths include a first signal path that overlaps the first group of control lines in the pixel-free region to increase loading on the first group of control lines.

16. A display, comprising:
an array of pixels including first and second rows of pixels, wherein the first row has fewer pixels than the second row;
a notch region that does not display images and that protrudes into the array of pixels, wherein the notch region interrupts the first row of pixels;
a light sensor located in the notch region;
control lines coupled to the array of pixels, and wherein the control lines include first and second control lines respectively coupled to the first and second rows of pixels, and wherein the first control line extends across the notch region;
signal paths that are orthogonal to the control lines and that are coupled to the array of pixels, wherein the signal paths include a first signal path that extends into the notch region; and
a loading structure in the notch region, wherein the loading structure and the first signal path overlap the first control line to compensate for a loading difference between the first and second control lines.

17. The display defined in claim 16 wherein the control lines have a reduced pitch in the notch region.

18. The display defined in claim 16 wherein the control lines comprise gate lines and the signal paths comprise data lines.

19. The display defined in claim 16 further comprising a transparent conductive layer that biases the loading structure, wherein the transparent conductive layer forms a common electrode in the array of pixels.

20. The display defined in claim 16 further comprising a metal layer that biases the loading structure, wherein the metal layer and the signal paths are formed from the same material.

* * * * *

UNITED STATES PATENT AND TRADEMARK OFFICE
CERTIFICATE OF CORRECTION

PATENT NO. : 11,594,190 B2
APPLICATION NO. : 17/401117
DATED : February 28, 2023
INVENTOR(S) : Shin-Hung Yeh, Abbas Jamshidi Roudbari and Ting-Kuo Chang It is certified that error appears in the above-identified patent and that said Letters Patent is hereby corrected as shown below:

On the Title Page

Left Column, Item (72), the inventor's name "Abbas Jamshidi Roudbar" should read -- Abbas Jamshidi Roudbari --

Signed and Sealed this
Thirtieth Day of January, 2024

Katherine Kelly Vidal
*Director of the United States Patent and Trademark Office*